(12) United States Patent
Burns et al.

(10) Patent No.: US 6,240,130 B1
(45) Date of Patent: May 29, 2001

(54) METHOD AND APPARATUS TO MEASURE JITTER.

(75) Inventors: Mark Burns, McKinney; David Ta-wei Kao, Plano; Turker Kuyel, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/124,199

(22) Filed: Jul. 28, 1998

Related U.S. Application Data

(60) Provisional application No. 60/054,562, filed on Jul. 30, 1997.

(51) Int. Cl.[7] ........................................ H04B 3/46
(52) U.S. Cl. .......................... 375/226; 375/224; 375/227
(58) Field of Search .................................. 375/226, 224, 375/227; 364/487

(56) References Cited

U.S. PATENT DOCUMENTS

| | | | | |
|---|---|---|---|---|
| 4,876,655 | * | 10/1989 | Carlton et al. | 364/487 |
| 4,896,271 | * | 1/1990 | Jenq et al. | 364/487 |
| 4,975,634 | * | 12/1990 | Shohet | 324/83 |
| 5,889,435 | * | 3/1999 | Smith et al. | 331/1 A |

OTHER PUBLICATIONS

Lin, Maoliu, Gao Xiaoming and sun shenghe, Testing Jitter in High Speed Telecommunication Systems, IEEE TENCON93/Beijing, pp. 55–58.*
Giovanni Chiorboli, Massimo Fontanili, and Carlo Morandi. A New Method for Estimating the Aperture Uncertainty of A/D Converters, IEEE vol. 47, No. 1, pp. 61–64.*
Jackie Chin, and antonio Cantoni, Phase Jitter= Timing Jitter?, IEEE 1998, vol. 2, No. 2, pp. 54–56.*

* cited by examiner

*Primary Examiner*—Stephen Chin
*Assistant Examiner*—Tony Al-Beshrawi
(74) *Attorney, Agent, or Firm*—Wade James Brady III; Frederick J. Telecky, Jr.

(57) ABSTRACT

A system and method for measuring jitter. One class of embodiments is particularly useful for testing the aperture jitter of a high speed Analog to Digital (A/D) converter. Aperture jitter in a Sample and Hold circuit (S/H) or in an A/D converter introduces noise into the sampled signal, which is more extreme in areas of the input waveform that have a steep positive or negative slope. The preferred embodiment allows an easy and inexpensive way to measure aperture jitter in S/H and A/D circuits. The technique can also be adapted for measuring edge jitter in digital clock signals or in analog sine wave signals.

17 Claims, 2 Drawing Sheets

METHOD AND APPARATUS TO MEASURE JITTER.

This application claims priority under 35 USC § 119(e)(1) of provisional application Ser. No. 60/054,562 filed Jul. 30, 1997.

BACKGROUND AND SUMMARY OF THE INVENTION

The present application relates to automated testing of integrated circuits, and more particularly to a method and system to test clock and aperture jitter in such devices as analog-to-digital converters and sample and hold circuits.

1. Background: Jitter

Jitter refers to the presence of abrupt, spurious variations in the amplitude or frequency of a periodic signal. This noise, when introduced in a system, can cause inaccurate results or other problems. Some noise will be present in any system, but if some or all of the noise can be measured, then it can be reduced or compensated for. The present application relates to means to measure noise caused by clock and aperture jitter.

2. Background: Jitter Measurement

Clock jitter has previously been measured using one of several techniques.

A first technique is to observe the spectral spreading or smearing around the spectral components of the clock. This technique is mainly used for circuits which must avoid generating energy in unwanted frequency bands. An example would be a cellular phone frequency synthesizer, which must produce a very pure sine wave which does not fail FCC compliance tests. This technique is unable to relate spectral spreading to time jitter, in RMS seconds.

A second commonly used technique is to slowly sweep the strobe signal of a strobed comparator across the rising or falling edge of the clock, capturing thousands of I/O outputs from the comparator. On a rising edge, the I/O sequence would start out with all 0's and then transition to all 1's. The percentage of 1's and 0's at each sweep position are recorded into a mathematical array. Then the derivative of the array provides the jitter histogram, from which the standard deviation of the jitter can be measured. This technique is very accurate, but requires a long test time because of the thousands of 1's and 0's that must be collected.

A third commonly used approach is to directly digitize the time intervals of the clock using a time digitizer. This type of circuit generally uses a time stretcher, which charges a capacitor with a fixed DC current for the time period to be measured and then discharges the capacitor with a small fraction of the DC current. The time required to discharge the capacitor is much easier to measure than the original time interval. Achieving one-shot measurements in the 20 ps range using this technique is very difficult, however. It is also very expensive.

A fourth technique involves digitization of multiple samples of the same point on a steeply rising edge with a constant slope (i.e., a very fast ramp). In this case, the voltage noise is related to the jitter by a very simple dv/dt relationship. This technique suffers from two problems. First the slope of the rising edge must be calibrated accurately, which is difficult to do. Second, there is no way to extract the voltage noise inherent to the digitization process from the jitter noise, since they both appear as voltage noise.

Innovative System and Methods for Measuring Jitter

The present application discloses an innovative system and method for measuring jitter. One class of embodiments is particularly useful for testing the aperture jitter of a high speed Analog to Digital (A/D) converter. Aperture jitter in a Sample and Hold circuit (S/H) or in an A/D converter introduces noise into the sampled signal. The noise is more extreme in areas of the input waveform that have a steep positive or negative slope. The preferred embodiment allows an easy and inexpensive way to measure aperture jitter in S/H and A/D circuits. The technique can also be adapted for measuring edge jitter in digital clock signals or in analog sine wave signals.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENT

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
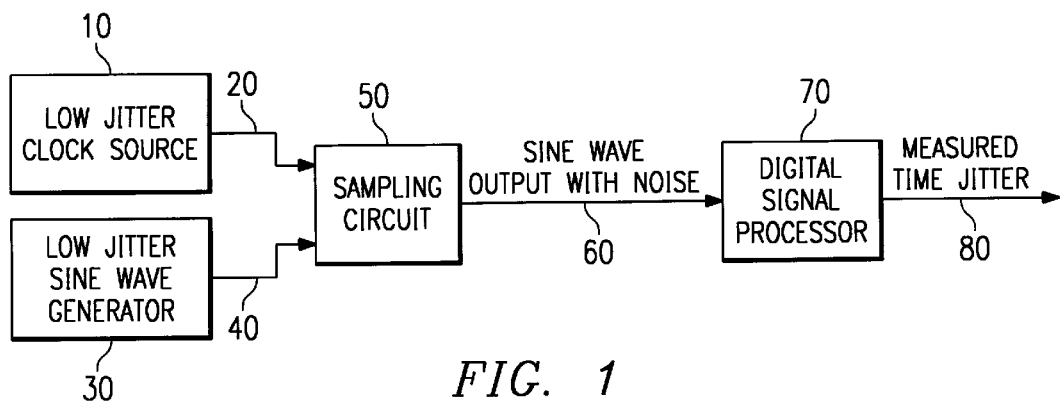
FIG. 1 shows a block diagram of the preferred embodiment.

The preferred embodiment, as shown in FIG. 1, is a jitter measurement circuit comprising a low jitter clock source 10, a low jitter sine wave generator 30, a sampling circuit 50, and a digital signal processor (DSP) 70. The measured jitter will comprise the summation of the jitter from the clock source 10, the sine wave generator 30, and the sampling circuit 50. The sampling circuit 50 can be either a Sample and Hold (S/H) circuit (followed by an analog signal digitizer), an analog to digital converter, or any other clocked sampling element that is subject to jitter.

This embodiment can be used to measure the jitter of the clock source 10, the jitter of the sine wave generator 30, or the sampling circuit 50. The jitter of any one of these elements can be accurately measured as long as the jitter introduced by the other two elements is substantially lower than that of the element under test.

Figure 3:
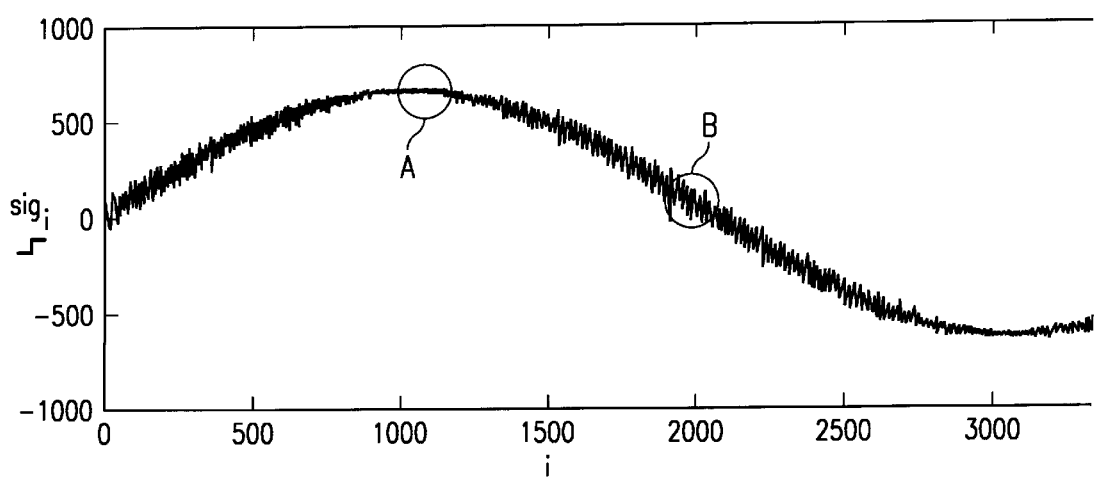
FIG. 3 shows an exemplary waveform with jitter indicated.

An example of jitter in an analog signal is shown in FIG. 3. Note that the jitter at the peak of the signal, indicated at A, is less than the apparent jitter at point B, where the slope of the signal is greater.

The sine wave generator 30 is first set to a frequency whose period is larger than the peak-to-peak jitter to be measured. A ratio of about 50 to 1 is desirable. If the period is larger than 50 times the jitter, then the noise induced by jitter is very small and thus difficult to measure. If the period is much smaller, then the mathematics of the present invention is subject to increasing error. The frequency of the low jitter clock source 10 is set to a frequency that causes N substantially evenly spaced samples of the sine wave 40 to be collected by the sampling circuit 50. The samples of the sine wave then appear at the input to the digital signal processor 70. The DSP 70 computes the signal to noise ratio, excluding distortion. Then, the jitter can be computed from the formula:

$$tj = \frac{1}{2 \cdot \pi \cdot Ft \cdot SNR}$$

in which:

tj=time jitter, in seconds,

SNR=RMS sine wave amplitude to RMS noise ratio (excluding distortion), and

Ft=sine wave frequency at 40, in Hz.

(Time jitter, in seconds, therefore equals the inverse of two times pi times the sine wave frequency at 40, in Hz, times the RMS sine wave signal-to-noise ratio, excluding distortion.)

This will give acceptable results for many cases. However, if a significant amount of voltage noise is produced by the sampling circuit 50 and/or the sine wave generator 30, then the value of tj will be higher than the true amount of jitter in the measurement system of FIG. 1.

The total noise is then the RMS summation of the two noise sources:

$$NT = \sqrt{(A \cdot 2 \cdot \pi \cdot Ft)^2 + Vn^2}$$

where:

NT=total RMS noise,

A=sine wave amplitude, RMS volts, vn=noise voltage, RMS volts, and

Ft=sine wave frequency at 40, in Hz.

The total RMS noise therefore equals the square root of ((the square of the peak to zero sine wave amplitude in volts times two times pi times the sine wave frequency at 40, in Hz) plus the square of the noise voltage in RMS volts).

Figure 4:
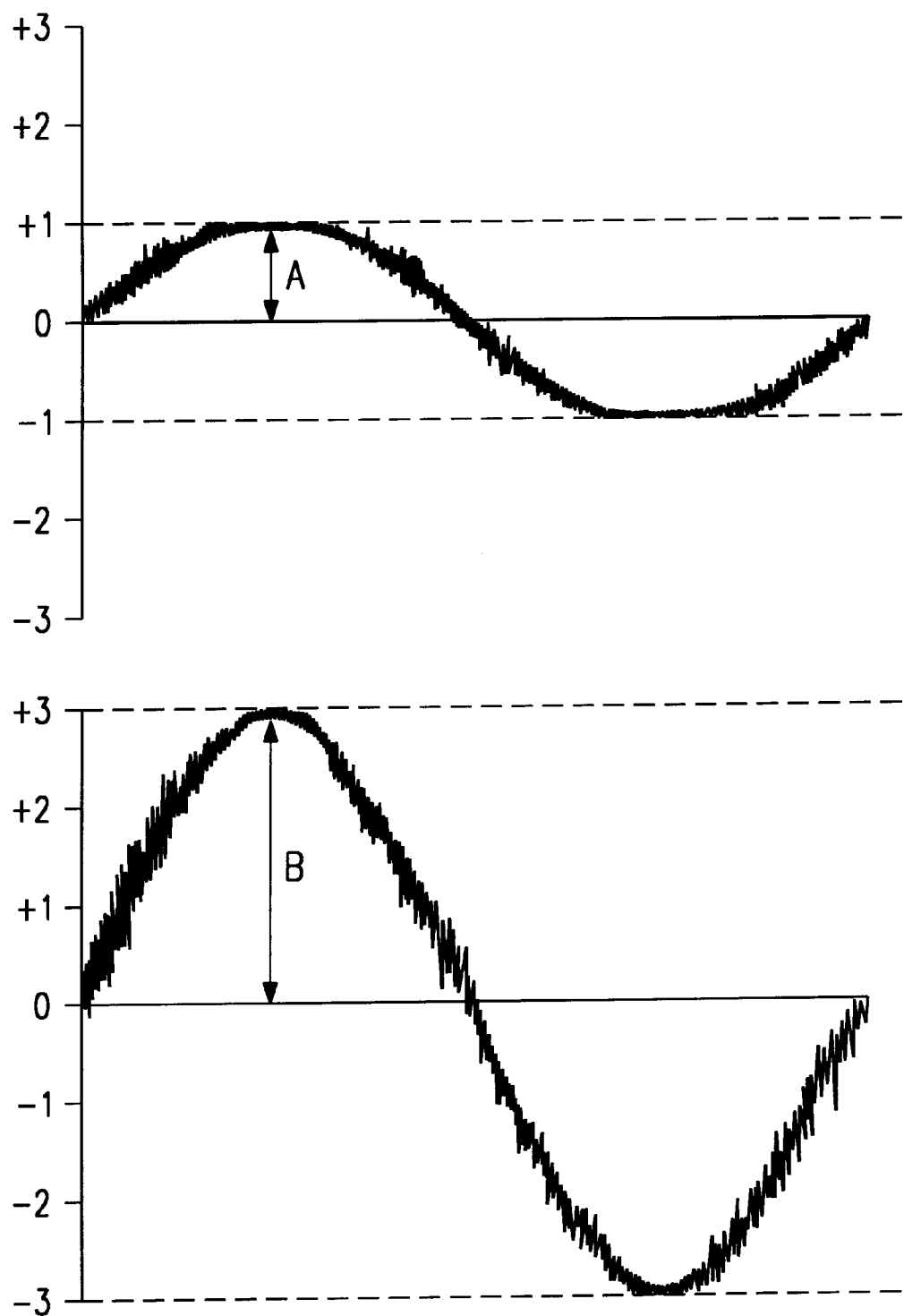
FIG. 4 shows two sine waves having different RMS amplitudes.

The solution to this problem is to measure two SNR values, SNR1 and SNR2 at two different sine wave RMS levels A and B, respectively, as shown in FIG. 4. The noise induced by jitter will increase linearly by a factor of B/A. Since the intrinsic voltage noise will remain substantially constant, the intrinsic voltage noise and jitter noise can be separated by using two equations with two unknowns.

Using the two measurements:

$$Nt1 = \sqrt{(A \cdot 2 \cdot \pi \cdot Ft)^2 + Vn^2}$$

$$Nt2 = \sqrt{(B \cdot 2 \cdot \pi \cdot Ft)^2 + Vn^2}$$

where:

Nt1=total noise measured with signal amplitude A, and

Nt2=total noise measured with signal amplitude B.

Therefore, Nt1 equals the square root of ((the square of (A times two times pi times Ft) plus the square of Vn). Nt2 equals the square root of ((the square of (B times two times pi times Ft) plus the square of Vn).

Solving two equations in two unknown yields the value of time jitter with noise jitter removed:

$$tj = \frac{1}{2 \cdot \pi \cdot Ft} \sqrt{\frac{(Nt1^2 - Nt2^2)}{A^2 - B^2}}$$

Time jitter equals the inverse of two times pi times Ft, times the square root of (Nt1 squared minus Nt2 squared) divided by (A squared minus B squared).

If the voltage noise comes mostly from the sine wave generator 30, then doubling the amplitude may double the voltage noise as well, and the previous equation will not work perfectly. In this case, there is an alternate solution. Since jitter is linearly related to frequency as well as amplitude, it is also possible to charge the frequency of the sine wave at 40 instead of the signal amplitude. Since a change in frequency may result in a change in amplitude, both Ft and A most be considered variables. In this case the equation would be:

$$tj = \frac{1}{2 \cdot \pi} \cdot \sqrt{\frac{(Nt1^2 - Nt2^2)}{A^2 Ft1^2 - B^2 Ft2^2}}$$

(Time jitter equals the inverse of (two times pi times A), times the square root of ((Nt1 squared minus Nt2 squared) divided by (A squared times Ft1 squared minus B squared times Ft2 squared))).

Figure 2:
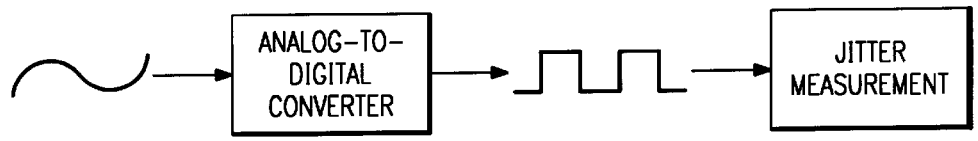
FIG. 2 shows an analog-to-digital converter connected to a system according to the preferred embodiment.

FIG. 2 shows a testing system in which an analog-to-digital converter converts an incoming signal to a digital output. This output is then passed to a jitter measurement system, as in the preferred embodiment, to measure the jitter in the digital output.

It should be noted that the sine wave(s) may have a frequency greater than the Nyquist frequency of the sampling circuit(50). The Nyquist frequency is defined as one half of the sampling rate. In such a case, the sine wave frequency will appear as an aliased sine wave with a frequency somewhere between 0 Hz and the Nyquist frequency. This technique is widely known as undersampling. Since under-sampling may provide a way to inject a much higher frequency sine wave into the sampling circuit, and since a higher frequency produces more noise from a given amount of jitter, undersampling provides a way to make the measurement system more sensitive to very low levels of jitter.

According to a disclosed class of innovative embodiments, there is provided a system for measuring jitter in an AC signal comprising: a clocking source connected to provide a clock signal; a test circuit connected to receive a sine wave at a sampling input and said clock signal at a clock input, and to produce N evenly spaced samples of said sine wave; a mathematical processor connected to receive said samples of said sine wave and to produce an output corresponding to the jitter of said input signal, said jitter being inversely proportional to the root-mean-square of a ratio between the amplitude and noise of each of said samples of said input signal. The mathematical processor preferably excludes noise related to harmonic distortion and is preferably compensated to reflect noise energy lost in the the exclusion of harmonic distortion. The calculation of jitter is compensated for noise energy lost in the exclusion of distortion components due to harmonic distortion using the mathematical processor therefor.

According to another disclosed class of innovative embodiments, there is provided a method for measuring jitter in an AC signal, comprising the steps of: providing a sine wave to the sampling input of a sampling circuit;

providing a clocking source to said sampling circuit, said clock source producing N evenly spaced samples of said sine wave at output of said sampling circuit, said sampling rate and said sine wave frequency chosen to sample an integer number of cycles of said sine wave; providing said samples of said sine wave to a mathematical processor; computing the signal amplitude A and noise Nt of said AC signal, using said processor; computing a total system jitter, using said processor, substantially according to the equation:

$$tj = \frac{1}{2 \cdot \pi \cdot Ft \cdot SNR}$$

According to another disclosed class of innovative embodiments, there is provided a method for measuring jitter in an AC signal, comprising the steps of: sampling a periodic input signal using a testing circuit; dividing said input signal into N evenly spaced samples of said input signal; calculating the jitter of said input signal, said jitter being inversely proportional to the signal-to-noise ratio of each of said samples of said input signal.

According to another disclosed class of innovative embodiments, there is provided a method for measuring jitter in an AC signal, comprising the steps of: providing a first sine wave to a sampling input of a sampling circuit at a first amplitude V1; providing a clocking source to said circuit under test, said clock source resulting in N evenly spaced samples of said first sine wave at output of said sampling circuit, said sampling circuit and said sine wave frequency chosen to sample an integer number of cycles of said sine wave; providing said samples of said first sine wave to a mathematical processor, said processor computing the signal amplitude A and noise Nt1; providing a second sine wave to said sampling input of said sampling circuit at a second amplitude V2; providing a clocking source to said sampling circuit, said clock source resulting in N evenly spaced samples of said second sine wave at output of said sampling circuit; providing said samples of said sine wave to said mathematical processor; and computing the signal amplitude B, noise Nt2, and total system jitter of said AC signal, using said processor, substantially according to the equation:

$$tj = \frac{1}{2 \cdot \pi \cdot Ft} \sqrt{\frac{(Nt1^2 - Nt2^2)}{A^2 - B^2}}$$

According to another disclosed class of innovative embodiments, there is provided a system for measuring jitter induced by a clock source, sine wave generator, and sampling circuit comprising: a clocking source connected to produce a clock signal; a circuit under test connected to receive said clock signal, a first sine wave having a first amplitude V1 and a frequency Ft1, and a second sine wave having a second amplitude V2 and a frequency Ft2, and connected to produce N evenly spaced samples of each of said first sine wave and said second sine wave at output of said circuit under test; a processor connected to receive said samples and to compute the signal amplitude A and noise Nt1 of said samples of said first sine wave, and to compute the signal amplitude B and noise Nt2 of said samples of said second sine wave; wherein said processor is further connected to produce an output corresponding to a total system jitter substantially given by the equation:

$$tj = \frac{1}{2 \cdot \pi} \cdot \sqrt{\frac{(Nt1^2 - Nt2^2)}{A^2 Ft1^2 - B^2 Ft2^2}}$$

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

What is claimed is:

1. A system for measuring jitter in an AC signal comprising:
a clocking source connected to provide a clock signal;
a test circuit connected to receive a sine wave at a sampling input and said clock signal at a clock input, and to produce N evenly spaced samples of said sine wave;
a mathematical processor connected to receive said samples of said sine wave and to produce an output corresponding to the jitter of said input signal, said jitter being inversely proportional to the root-mean-square of a ratio between the amplitude and noise of each of said samples of said input signal.

2. The system of claim 1, wherein said output of said mathematical processor excludes noise related to harmonic distortion.

3. The system of claim 1, wherein said output of said mathematical processor excludes noise related to harmonic distortion, and is compensated to reflect noise energy lost in said exclusion of harmonic distortion.

4. The method of claim 1, wherein said sine wave exceeds the Nyquist frequency of said test circuit.

5. A method for measuring jitter in an AC signal, comprising the steps of:
sampling a periodic input signal using a testing circuit;
dividing said input signal into N evenly spaced samples of said input signal;
calculating the jitter of said input signal, said jitter being inversely proportional to the signal-to-noise ratio of each of said samples of said input signal.

6. The method of claim 5, wherein harmonic distortion is excluded from said calculation of jitter, and further comprising the step of adjusting said calculation of jitter, to compensate for noise energy lost in said exclusion of distortion components.

7. The method of claim 5, wherein the frequency of said periodic input signal exceeds the Nyquist frequency of said sampling circuit.

8. A method for measuring jitter in an AC signal, comprising the steps of:
providing a sine wave to the sampling input of a sampling circuit;
providing a clocking source to said sampling circuit, said clock source producing N evenly spaced samples of said sine wave at output of said sampling circuit, said sampling rate and said sine wave frequency chosen to sample an integer number of cycles of said sine wave;
providing said samples of said sine wave to a mathematical processor;
computing the signal amplitude A and noise Nt of said AC signal, using said processor;
computing a total system jitter, using said processor, substantially according to the equation:

$$tj = \frac{1}{2\cdot\pi\cdot Ft\cdot SNR}$$

where tj=time jitter in seconds, SNR=RMS sine wave amplitude to RMS noise ratio (excluding distortion) and Ft=sine wave frequency in Hz.

9. The method of claim 8, wherein harmonic distortion is excluded from said computation of noise, and further comprising the step of adjusting said computation of noise, using said processor, to compensate for noise energy lost in said exclusion of distortion components.

10. The method of claim 8, wherein said sine waves exceed the Nyquist frequency of said sampling circuit.

11. A method for measuring jitter in an AC signal, comprising the steps of:

provide a first sine wave to a sampling input of a sampling circuit at a first amplitude V1;

providing a clocking source to a circuit under test, said clock source resulting in N evenly spaced samples of said first sine wave at output of said sampling circuit, said sampling circuit and said sine wave frequency chosen to sample an integer number of cycles of said sine wave;

providing said samples of said first sine wave to a mathematical processor, said processor computing the signal amplitude A and noise Nt1;

providing a second sine wave to said sampling input of said sampling circuit at a second amplitude V2;

providing a clocking source to said sampling circuit, said clocking source resulting in N evenly spaced samples of said second sine wave at output of said sampling circuit;

providing said samples of said sine wave to said mathematical processor; and computing the signal amplitude B, noise Nt2, and total system jitter of said AC signal, using said processor, substantially according to the equation:

$$tj = \frac{1}{2\cdot\pi\cdot Ft}\sqrt{\frac{(Nt1^2 - Nt2^2)}{A^2 - B^2}}$$

where tj=time jitter in seconds SNR=RMS sine wave amplitude to RMS noise ratio (excluding distortion) and Ft=sine wave frequency in Hz.

12. The method of claim 11, wherein harmonic distortion is excluded from said computation of noise, and further comprising the step of adjusting said computation of noise, using said processor, to compensate for noise energy lost in said exclusion of distortion components.

13. The method of claim 11, wherein said sine waves exceed the Nyquist frequency of said sampling circuit.

14. The method of claim 11, wherein said first sine wave is provided at a first frequency of Ft1;

said second sine wave is provided at a second frequency of Ft2;

and said total system jitter is computed according to the equation:

$$tj = \frac{1}{2\pi}\cdot\sqrt{\frac{(Nt1^2 - Nt2^2)}{A^2 Ft1^2 - B^2 Ft2^2}}$$

15. The method of claim 14, wherein harmonic distortion is excluded from said computation of noise, and further comprising the step of adjusting said computation of noise, using said processor, to compensate for noise energy lost in said exclusion of distortion components.

16. The method of claim 14, wherein said sine waves exceed the Nyquist frequency of said sampling circuit.

17. A system for measuring jitter induced by a clock source, sine wave generator, and sampling circuit comprising:

a clocking source connected to produce a clock signal;

a circuit under test connected to receive said clock signal, a first sine wave having a first amplitude V1 and a frequency Ft1, and a second sine wave having a second amplitude V2 and a frequency Ft2, and connected to produce N evenly spaced samples of each of said first sine wave and said second sine wave at output of said circuit under test;

a processor connect to receive said samples and to compute the signal amplitude A and noise Nt1 of said samples of said first sine wave, and to compute the signal amplitude B and noise Nt2 of said samples of said second sine wave;

wherein said processor is further connected to produce an output corresponding to a total system jitter substantially given by the equation:

$$tj = \frac{1}{2\cdot\pi}\cdot\sqrt{\frac{(Nt1^2 - Nt2^2)}{A^2 Ft1^2 - B^2 Ft2^2}}$$

where tj=time jitter in seconds.

* * * * *